United States Patent
Chen et al.

(10) Patent No.: US 7,702,942 B2
(45) Date of Patent: Apr. 20, 2010

(54) METHOD FOR GENERATING ADJUSTABLE MRAM TIMING SIGNALS

(75) Inventors: Kuang-Lun Chen, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 754 days.

(21) Appl. No.: 11/530,650

(22) Filed: Sep. 11, 2006

(65) Prior Publication Data

US 2007/0070732 A1 Mar. 29, 2007

Related U.S. Application Data

(60) Provisional application No. 60/716,198, filed on Sep. 12, 2005.

(51) Int. Cl.
*G06F 1/00* (2006.01)
*G06F 1/04* (2006.01)
*G06F 12/00* (2006.01)

(52) U.S. Cl. ............. 713/500; 713/400; 713/401; 713/503; 713/600; 711/100

(58) Field of Classification Search ............. 713/400, 713/401, 500, 503, 600; 711/100
See application file for complete search history.

(56) References Cited

U.S. PATENT DOCUMENTS

| | | | | |
|---|---|---|---|---|
| 4,079,456 A | * | 3/1978 | Lunsford et al. | 713/401 |
| 4,733,294 A | * | 3/1988 | Wesolowski | 348/498 |
| 5,692,165 A | * | 11/1997 | Jeddeloh et al. | 713/400 |
| 5,819,075 A | * | 10/1998 | Forsmo | 713/401 |
| 5,944,833 A | * | 8/1999 | Ugon | 713/400 |
| 6,845,459 B2 | * | 1/2005 | Lin | 713/401 |
| 7,107,477 B1 | * | 9/2006 | Singh et al. | 713/503 |
| 2001/0038565 A1 | * | 11/2001 | Matsuzaki | 365/222 |
| 2006/0132203 A1 | * | 6/2006 | Lee | 327/158 |

* cited by examiner

*Primary Examiner*—Mark Connolly
(74) *Attorney, Agent, or Firm*—Thomas, Kayden, Horstemeyer & Risley

(57) ABSTRACT

A variable timing system for a magnetoresistive random access memory circuit (MRAM IC) is embedded in an MRAM IC and includes a number of timing control circuits, where each timing control circuit generates a timing control signal. A number of variable timing circuits are each coupled to receive at least two of the timing control signals, and each of the number of timing circuits outputs a variable timing in response to the timing control signals. At least one MRAM timing driver is connected to receive the variable timing.

9 Claims, 3 Drawing Sheets

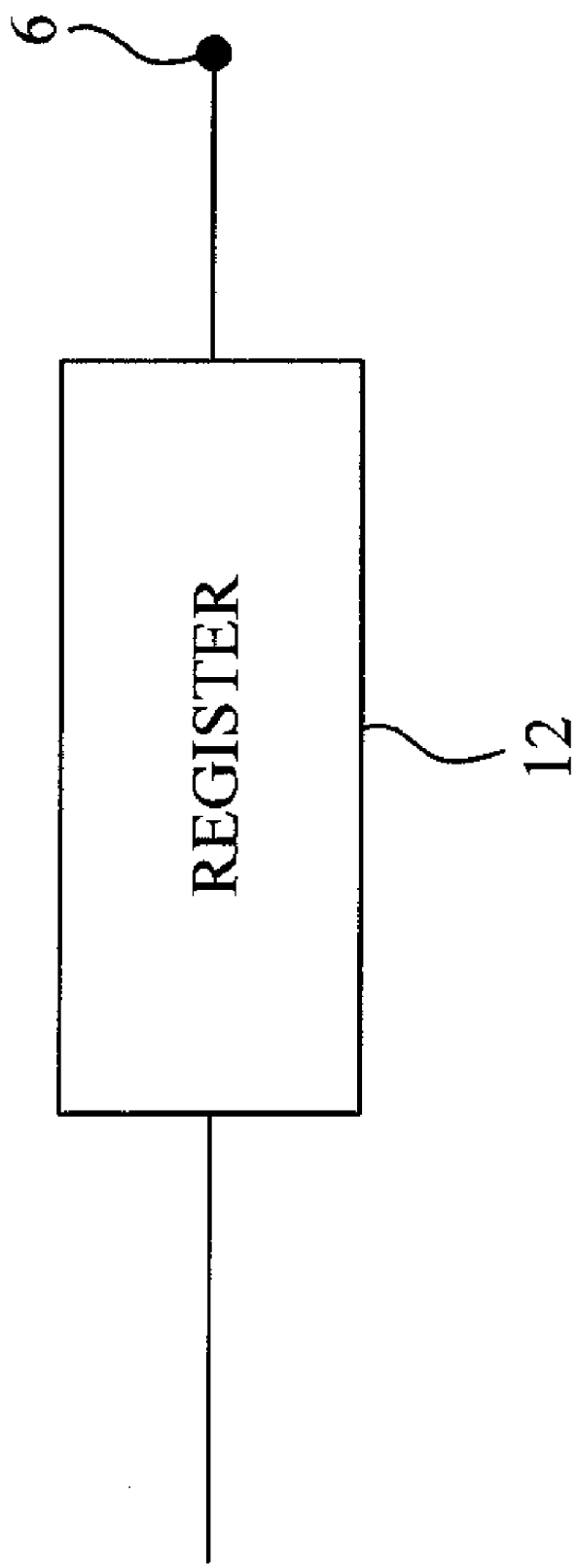

US 7,702,942 B2

METHOD FOR GENERATING ADJUSTABLE MRAM TIMING SIGNALS

CROSS-REFERENCE TO RELATED APPLICATION

This application claims the priority benefit of U.S. Provisional Application Ser. No. 60/716,198, filed Sep. 12, 2005, the full disclosures of which are incorporated herein by reference.

BACKGROUND

1. Field of Invention

The present invention relates to magnetoresistive random access memory integrated circuits (MRAM IC's), and, more particularly, to variable timing circuits embedded in an MRAM IC.

2. Description of Related Art

The operation of an MRAM is similar to that of nonvolatile or "regular" memory technologies in that there is a read and a write operation. However, an MRAM requires more complex and more tightly controlled timing signals for both the read and the write operations to be successful than do most regular memories. Optimal timing relations including, for example, relative arrival times and signal duration, of the timing signals are affected by processing variations and operating conditions as is other electronic circuitry on an MRAM IC chip. In addition, variations in magnetic films inherent in MRAM IC technology influence and affect the set of optimal timing signals as well. The variations in magnetic films include chemical composition, orientation, and geometry, to name a few.

Due to the complex and sensitive nature of the required timing signals, it is desirable to have the ability to modify the timing signals after completed fabrication of an MRAM IC chip. Prior solutions involve having separate test vehicles and production parts where the production parts are preset with the values determined by the test vehicles. There remains a need for an MRAM IC having variable timing circuits that permit using the same part as both a test vehicle and a production part.

SUMMARY

In one aspect of the present invention, circuitry and structures are employed to allow the same part to be used as a test vehicle and a full production part, where, as a test vehicle, the number of external pads is substantially reduced by using an internal register chain to generate the control of variable timing circuits.

In another aspect of the invention, as a production part, programmable fuses are used with the internal register chain to provide a default operating set of timing signals. Since programmable fuses can be altered post-production, yields of MRAM IC chips are expected to be substantially increased across processing and operating variations.

According to one embodiment of the present invention, a variable timing system for a magnetoresistive random access memory circuit (MRAM IC) is provided. The variable timing system is embedded in an MRAM IC and includes a plurality of timing control circuits, where each timing control circuit generates a timing control signal. A plurality of variable timing circuits are each coupled to receive at least two of the timing control signals, and each of the plurality of variable timing circuits outputs a variable timing signal in response to the timing control signals. At least one MRAM current driver is connected to receive the variable timing signal.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 3 is a schematic circuit diagram of an example of an alternative timing control circuit embedded in an MRAM IC integrated circuit according to one embodiment of the present invention.

DESCRIPTION OF THE PREFERRED EMBODIMENTS

Figure 1:
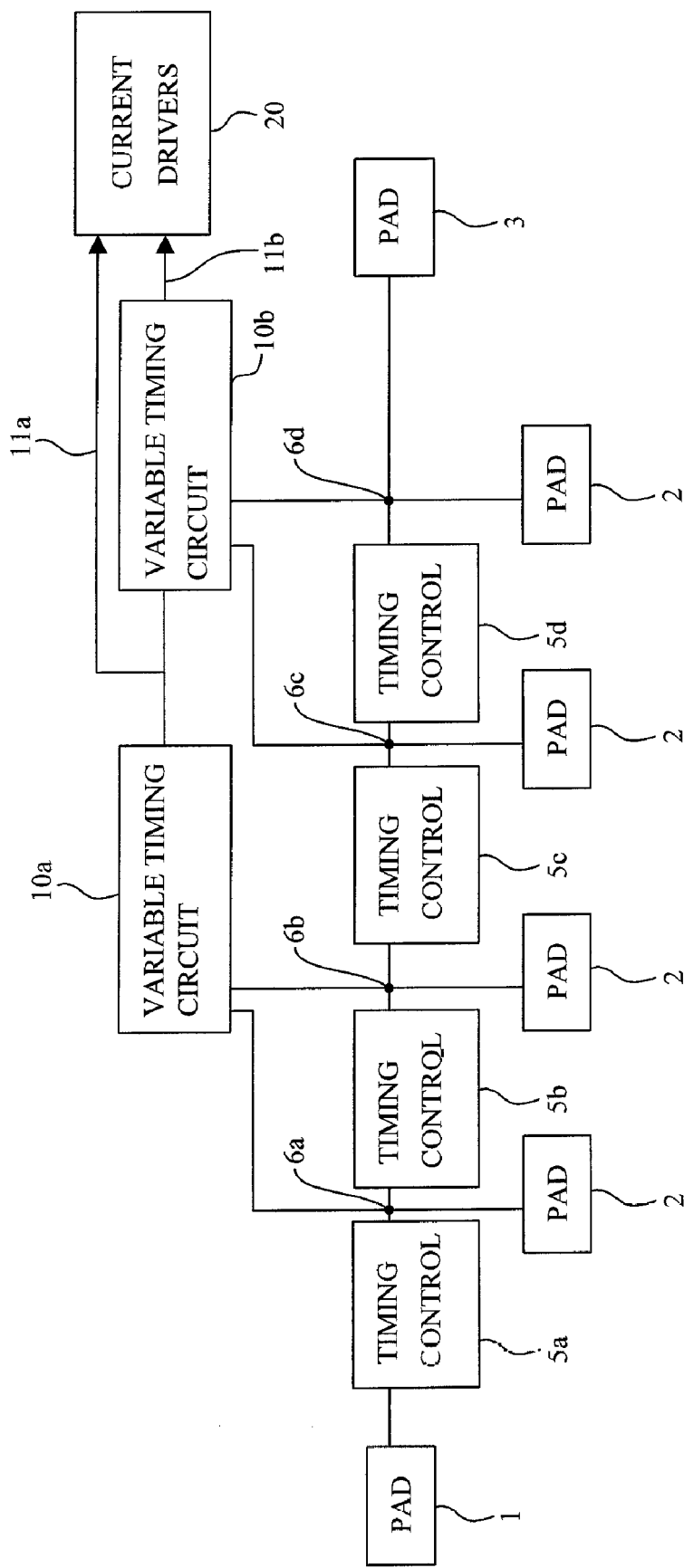
FIG. 1 is a schematic circuit diagram of a variable timing system embedded in a magnetoresistive random access memory integrated circuit (MRAM IC) according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Referring now to FIG. 1 there shown schematically is a variable timing system embedded in a magnetoresistive random access memory integrated circuit (MRAM IC) 4. The variable timing system includes more than one timing control circuits 5A, 5B, 5C, and 5D, and each timing control circuit 5A, 5B, 5C, and 5D generates a timing control signal at nodes 6A, 6B, 6C, and 6D. Variable timing circuits 10A, 10B are each connected to receive at least two timing control signals. Each of the variable timing circuits 10A, 10B has an output 11A, 11B for transmitting a variable timing signal to at least one MRAM current driver 20 connected to receive the variable timing signal. The MRAM current driver 20 may be one of a word current driver for reading or a word current driver for writing to an MRAM memory cell.

In one embodiment, the variable timing circuits 10A, 10B each receive at least two binary control signals from the nodes 6A, 6B, 6C, and 6D. Those skilled in the art and having the benefit of this disclosure will understand that the number of control inputs and timing control circuits may vary for a variable timing circuit to provide different timing granularity and range, for example.

In one embodiment for a testing vehicle, an initial control signal may be impressed upon a first conduction pad 1 and input into a first timing control 5A. More than one read out elements, such as, for example, conductive pads 2, 3 may optionally be used to provide signal information at the nodes 6A, 6B, 6C, and 6D. In one embodiment, the timing control circuits 5A, 5B, 5C, and 5D may be arranged in a scan fashion. The scan fashion arrangement comprises a series arrangement of each of the timing control circuits 5A, 5B, 5C, and 5D and the output of each of the timing control circuits is coupled to the input of a subsequent one of the timing control circuits. Each stage of the register scan chain may be optionally wired to an external pad if desired.

Where the MRAM IC is intended to be a test vehicle, extra external pads are provided to increase the testability and observability of a circuit and to provide extra monitoring points. Where the MRAM IC is intended to be a production part, the number of bonded pads can be reduced. As described above, a scan register chain can be used in the MRAM such that all the controlling binary signals of the individual timing circuits may be set and scanned in series from one single external pad, such as pad 3.

In one embodiment of the present invention, the scan fashion arrangement comprises a series arrangement of the plurality of timing control circuits 5A, 5B, 5C, and 5D, and the output of each of the timing control circuits 5A, 5B, 5C, and 5D is coupled to the input of a subsequent one of the timing control circuits 5A, 5B, 5C, and 5D.

In one embodiment of the invention, the variable timing circuits comprise variable time delay elements arranged in series, and more than one differing timing signals are tapped off at stages as needed. As described hereinabove, the variable delay elements are controlled by binary signals where the number of binary signals per delay element may vary depending on the delay granularity and range of delay desired in each time delay element. In determining the optimal settings for each variable delay element, observability and testability of each variable delay block is desirable. To address this, the binary control signals can be supplied from external pads or from internal storage registers provided specifically for this purpose. Also, the output of each delay block can be connected to external pads to provide a means to test and measure the actual delay produced by each variable delay block.

Figure 2:
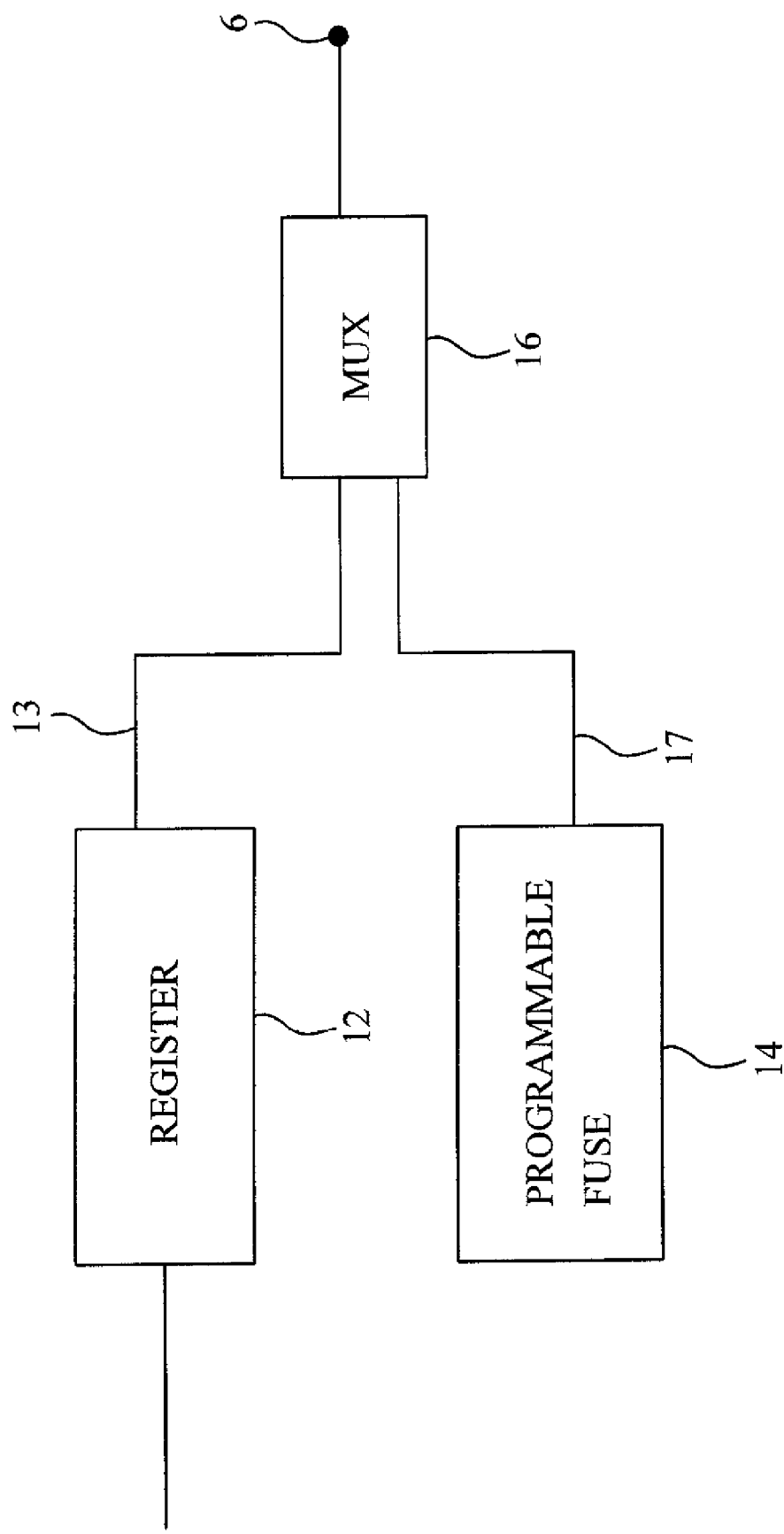
FIG. 2 is a schematic circuit diagram of an example of a timing control circuit embedded in an MRAM IC according to one embodiment of the present invention.

Referring now to FIG. 2 there shown schematically is an example of a timing control circuit 5 that may be used in a variable timing system embedded in a magnetoresistive random access memory (MRAM) integrated circuit according to one embodiment of the present invention. Any one or all of the timing control circuits 5A, 5B, 5C, and 5D may include the components of the timing control circuit 5 including a register 12, a programmable fuse 14 and a multiplexer 16.

The register 12 has a register output 13 and the programmable fuse 14 has a programmable signal output 17. The multiplexer 16 is connected to receive the register output 13 and the programmable signal output 17. The multiplexer 16 is controlled to select one of the register output or the programmable signal output as a timing control signal routed through node 6 to at least one of the plurality of variable timing circuits 10A, 10B, for example. Node 6 corresponds to any of nodes 6A, 6B, 6C, and 6D, for example.

The configuration shown in FIG. 2 illustrates one configuration for further improving the flexibility of an MRAM IC for use both as a test vehicle and as a production part default register values set by programmable fuses. Circuitry is provided to multiplex the control signal of each variable timing circuit between the register value and the preset value provided by the programmable fuse. One strength of this arrangement is that the set of timing levels can be tested to find an optimal set of timing values. If the optimal set is different than the preset values of the programmable fuses, then the fuses can be altered to yield the optimal set of timing signals. This provides an invaluable means to accommodate multiple operating points with a single MRAM circuit since programming can be done post-production.

Referring now to FIG. 3 there shown schematically is an alternate example of a timing control circuit 5' that may be used in a variable timing system embedded in an MRAM IC according to one embodiment of the present invention. Any one or all of the timing control circuits 5A, 5B, 5C, and 5D may include a register 12. In one embodiment, the timing control circuits 5A, 5B, 5C, and 5D further have two or more registers 12 arranged in a scan fashion as shown in FIG. 1. The register 12 outputs a binary variable timing control signal generated in response to the variable circuits.

In contrast to the prior art, the embodiment provides a variable MRAM timing apparatus and method wherein timing signals are generated from a string of variable timing circuits connected in series. The variable timing circuits are controlled, for example, by binary signals supplied from either external pads or from internal storage registers. Using the binary signals, optimal timing of an MRAM IC design can be evaluated and set after the design fabrication. The signals from a plurality of variable timing circuits in series may optionally be connected to external pads to permit timing measurement. Furthermore, in accordance internal storage registers may be organized in a scan arrangement and programmable fuses can be used to set the register values.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A variable timing system embedded in a magnetoresistive random access memory integrated circuit (MRAM IC) comprising:
    a plurality of timing control circuits, wherein each timing control circuit generates a timing control signal, wherein each of the plurality of timing control circuits further comprises:
        a register having a register output;
        a programmable fuse having a programmable signal output; and
        a multiplexer connected to receive the register output and the programmable signal output;
    a plurality of variable timing circuits, wherein each variable timing circuit is coupled to receive at least two of the timing control signals, wherein each of the plurality of variable timing circuits outputs a variable timing in response to the timing control signals, wherein the multiplexer is controlled to select one of the register output and the programmable signal output as a timing control signal routed to at least one of the plurality of variable timing circuits; and
    at least one MRAM IC current driver connected to receive the variable timing.

2. The variable timing system of claim 1, wherein the plurality of timing control circuits further comprise a plurality of registers arranged in a scan fashion.

3. The variable timing system of claim 2, wherein the scan fashion arrangement comprises a series arrangement of each of the timing control circuits wherein the output of each of the plurality of timing control circuits is coupled to the input of a subsequent one of the plurality of timing control circuits.

4. The variable timing system of claim 1, wherein the plurality of timing control circuits have outputs coupled to a read out element.

5. The variable timing system of claim 4, wherein the read out element comprises a conductive pad.

6. The variable timing system of claim 1 wherein, the plurality of timing control circuits are arranged in a scan fashion arrangement.

7. The variable timing system of claim 6 wherein the scan fashion arrangement comprises a series arrangement of each of the timing control circuits wherein the output of each of the plurality of timing control circuits is coupled to the input of a subsequent one of the plurality of timing control circuits.

8. The variable timing system of claim 1, wherein the plurality of timing control circuits have outputs coupled to a read out element.

9. The variable timing system of claim 8, wherein the read out element comprises a conductive pad.

* * * * *